(12) United States Patent  (10) Patent No.: US 7,199,741 B2
Clara et al.  (45) Date of Patent: Apr. 3, 2007

(54) METHOD FOR DIGITAL/ANALOG CONVERSION AND CORRESPONDING DIGITAL/ANALOG CONVERTER DEVICE

(75) Inventors: Martin Clara, Villach (AT); Wolfgang Klatzer, Mittertrixen (AT); Andreas Wiesbauer, Pörtschach (AT)

(73) Assignee: Infineon Technologies AG, Munich (DE)

( * ) Notice: Subject to any disclaimer, the term of this patent is extended or adjusted under 35 U.S.C. 154(b) by 169 days.

(21) Appl. No.: 10/971,570

(22) Filed: Oct. 22, 2004

(65) Prior Publication Data

US 2005/0116851 A1 Jun. 2, 2005

(30) Foreign Application Priority Data

Oct. 24, 2003 (DE) ................................ 103 49 567
Feb. 2, 2004 (DE) ....................... 10 2004 005 138

(51) Int. Cl.
*H03M 1/66* (2006.01)
(52) U.S. Cl. ........................................ 341/144; 341/59
(58) Field of Classification Search .......... 341/50–144, 341/110, 155, 139, 94, 58, 59
See application file for complete search history.

(56) References Cited

U.S. PATENT DOCUMENTS

| 4,405,916 | A | | 9/1983 | Hornak et al. |
| 4,499,454 | A | * | 2/1985 | Shimada ....................... 341/58 |
| 5,227,793 | A | | 7/1993 | Aisu |
| 5,479,168 | A | * | 12/1995 | Johnson et al. ............. 341/144 |
| 5,838,274 | A | * | 11/1998 | Johnson et al. ............. 341/139 |
| 5,864,311 | A | * | 1/1999 | Johnson et al. ............. 341/144 |
| 5,872,531 | A | * | 2/1999 | Johnson et al. ............. 341/144 |
| 6,204,796 | B1 | * | 3/2001 | Chan et al. .................. 341/176 |
| 6,346,901 | B1 | | 2/2002 | Aiura et al. |
| 6,426,715 | B1 | | 7/2002 | Westra et al. |
| 6,897,793 | B1 | * | 5/2005 | Kim et al. ..................... 341/59 |
| 2001/0026232 | A1 | | 10/2001 | Anderson |
| 2003/0001764 | A1 | | 1/2003 | Ruha et al. |
| 2003/0169194 | A1 | | 9/2003 | Aiura et al. |
| 2004/0004565 | A1 | | 1/2004 | Melanson |

FOREIGN PATENT DOCUMENTS

EP 0 898 374 A2 2/1999

* cited by examiner

*Primary Examiner*—Lam T. Mai
(74) *Attorney, Agent, or Firm*—Maginot Moore & Beck (57) ABSTRACT

A method and a device for digital/analog conversion are proposed, whereby for improved use of a "dynamic element matching" algorithm, in particular a "data weighted averaging" algorithm, the number of existing conversion elements is greater than a maximum number of possible input or control codes for the conversion elements (7), that is to say greater than a number of conversion elements, which would actually be necessary for a maximum value of the digital word to be converted in each case.

28 Claims, 8 Drawing Sheets

METHOD FOR DIGITAL/ANALOG CONVERSION AND CORRESPONDING DIGITAL/ANALOG CONVERTER DEVICE

FIELD OF THE INVENTION

The present invention relates to a method for digital/analog conversion as well as a digital/analog converter device configured accordingly. In particular the present invention relates to a method and a device for digital/analog conversion with "dynamic element matching" (DEM).

BACKGROUND

Sigma delta modulators or sigma delta analog/digital converters are being increasingly used to replace conventional analog/digital converter architectures in applications, where analog/digital conversion with high resolution and at the same time enhanced linearity is required. The special linearity of sigma delta modulators moreover means that sigma delta modulators are very well suited for realization in CMOS circuit technology. In addition, the dynamic range of the sigma delta modulator can be increased by multi-bit quantization, whereby a further consequence of multi-bit quantization is improved system stability.

A digital/analog converter (D/A converter) is used in the feedback path of sigma delta modulators, for which high linearity is required. The non-linearity of D/A converters can be corrected in sigma delta modulators for example by digital self-calibration of the sigma delta modulator, which however entails greater complexity of circuit design. A further concept for improving the non-linearity of not ideal D/A converters is the use of a so-called "dynamic element matching" algorithm.

Figure 7:
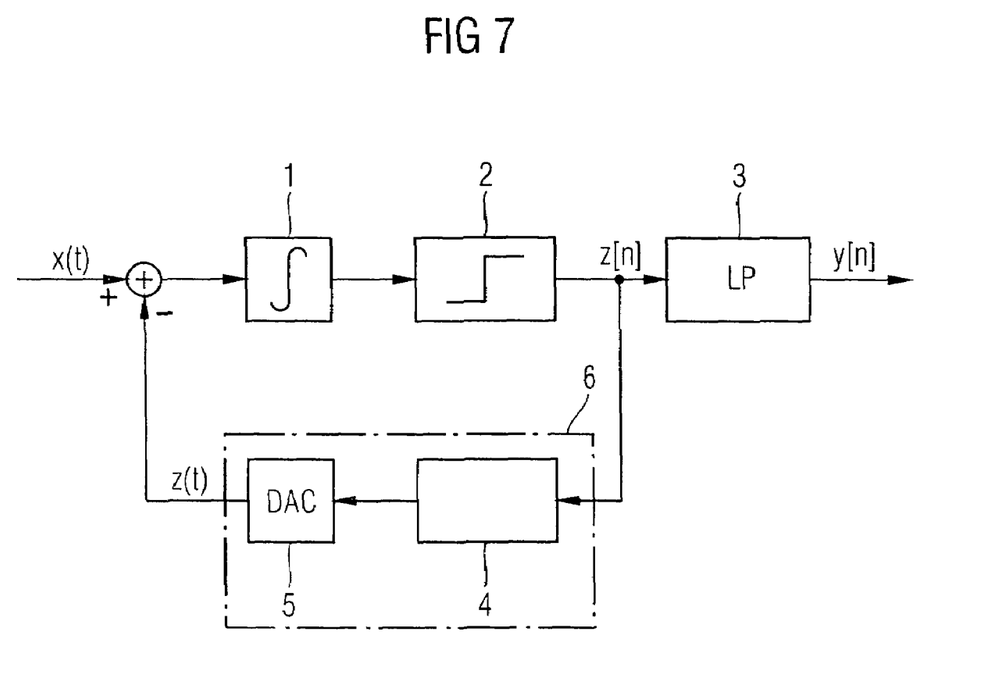
FIG. 7 shows a simplified block diagram of a sigma delta modulator, to which the present invention can be applied.

FIG. 7 shows a simplified block diagram of a sigma delta modulator and/or a sigma delta A/D converter with "dynamic element matching". The sigma delta modulator shown in FIG. 7 serves to convert an analog and time-continuous input signal x(t) into a corresponding digital time-discrete output signal y[n]. For this purpose, the sigma delta modulator comprises a forward path with an integrator 1 and a quantizer 2, whereby both a 1 bit quantizer and a multi-bit quantizer can be used. The time-discrete output signal z[n] quantized by the quantizer 2 is fed to a low-pass (LP) filter 3, on whose output the desired digital output signal y[n] is finally provided. Furthermore, the output signal of the quantizer 2 is fed back via a feedback path with a D/A converter device 6 to the input of the sigma delta modulator, whereby the analog output signal z(t) generated by the D/A converter device 6 is subtracted as shown in FIG. 7 from the analog input signal x(t), in order to feed the differential signal resulting therefrom to the integrator 1. Here, it is assumed that in the feedback path not ideal, that is to say not completely linear, D/A conversion is carried out, i.e. the D/A converter device 6 comprises a not ideal D/A converter 5. For compensation of the non-linearity of this non-linear D/A converter 5 the D/A converter device 6 also comprises a conversion element selection logic 4, which by application of a "dynamic element matching" algorithm triggers the individual D/A conversion elements of the D/A converter (DAC) 5 in such a manner that the conversion errors are averaged out as much as possible over several sampling runs. By means of the selection process of the conversion element selection logic 4 the in-band signal interference can be substantially reduced due to the non-linearity of the D/A converter 5. The aim of "dynamic element matching" is to average out matching errors of the individual D/A levels of the not ideal D/A converter 5 in such a manner that the non-linear distortion is converted into broadband noise, where it can be filtered out later. This is equivalent to an increase in the effective resolution after the filter operation.

Up till now various concepts have been proposed as "dynamic element matching" algorithms. In accordance with a first concept it was proposed that the conversion elements of the D/A converter 5 are selected in arbitrary and/or random order, that is to say the conversion elements are not selected according to a pre-determined pattern. By way of this concept, the linearity can be improved, since due to the fact that the distortion of the non-linear D/A converter 5 is distributed evenly over the entire frequency spectrum, only part of the noise falls into the base-band. In accordance with a further concept, which is also known as clocked averaging, for selecting the conversion elements of the not ideal D/A converter 5 a start index is used, which is incremented by the sampling cycle. With this concept, each conversion element is used at a minimum rate, which corresponds to the quotient resulting from the sampling rate and the total number of conversion elements. In the case of this concept the noise resulting from multiples of this minimum rate is concentrated and otherwise virtually evenly distributed over the other frequencies. Beside the concepts described above individual level averaging (ILA) has also been proposed, whereby with this concept in contrast to clocked averaging (CLA) an individual start index is used for each conversion level of the D/A converter 5. Thus, for each conversion level the error caused thereby can be averaged out after several repeated demands of the same conversion level and thus reduced to almost zero.

Apart from the concepts for a "dynamic element matching" algorithm described above a concept to improve the linearity of multi-bit sigma delta modulators and/or the D/A converters used therein, which is called data weighted averaging (DWA) has also been proposed. In accordance with this concept all conversion elements of the D/A converter 5 are operated at the maximum rate, whereby at the same time it is ensured that each conversion element is used as often as possible. This is achieved by the fact that the conversion elements are sequentially selected for each conversion operation in such a manner that said operation starts with the next available unused conversion element.

This principle will be described below by way of example on the basis of FIG. 8A–FIG. 8C, whereby it is assumed that a digital word to be converted into a corresponding analog output signal is fed to a 3 bit D/A converter 5, comprising a plurality of conversion elements 7, that in the case of the example illustrated are shown in the form of current sources and are switched in parallel between an input terminal, which is connected to a positive supply voltage VDD and an output terminal, which is connected to a negative supply voltage VSS or earth. The bit width of the D/A converter 5 thus amounts to B=3. Dependent on the value of the 3 bit digital word supplied a corresponding number of conversion elements 7 of the D/A converter 5 is activated, that is to say by triggering controllable switches allocated accordingly between the supply voltage connection VDD and the earth connection, so that an analog output signal is generated by the D/A converter 5, which corresponds to the sum of the current signals generated by the individual activated conversion elements 7. For a B bit D/A converter 5 therefore a total number of $N=2^b-1$ conversion elements 7 is necessary, in order to cover the entire range of values of the B bit digital word. In the case of the example illustrated N=7 applies.

Figure 8A:
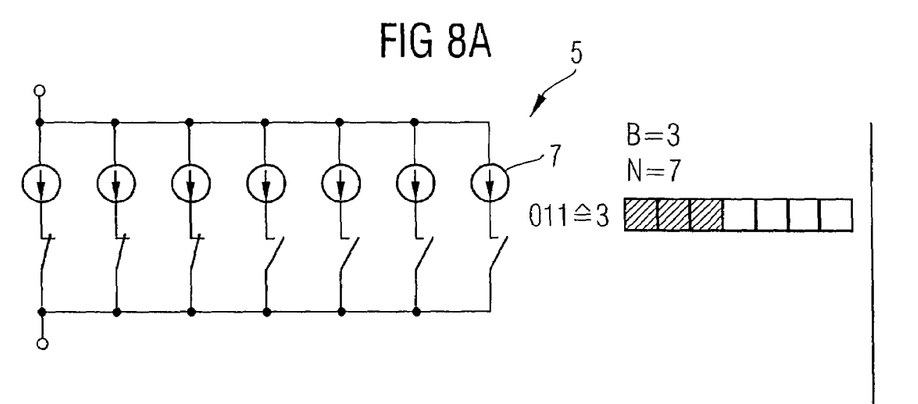
FIG. 8A–FIG. 8C show illustrations of a digital/analog converter device in accordance with the prior art.

As shown in FIG. 8 first it is assumed that a digital word with the bit sequence "011" is fed to the D/A converter 5, which corresponds to the decimal value "3", so that in accordance with FIG. 8A the first three conversion elements 7 of the D/A converter 5 are selected and activated accordingly, while the other conversion elements remain deactivated. In FIG. 8A the state and/or activation/deactivation of the individual conversion elements 7 of the D/A converter 5 is indicated by an array of boxes, whereby a box is allocated to each conversion element 7. A hatched box means that the corresponding conversion element has been activated and selected, while a blank box means that the corresponding conversion element has not been selected and is therefore deactivated.

In accordance with FIG. 8B a digital word with the bit sequence "001" corresponding to the decimal value "1" is subsequently fed to the D/A converter 5, whereby in FIG. 8B it is shown that the next and previously unused conversion element 7 of the D/A converter 5 is selected accordingly, while all other conversion elements are deactivated.

Figure 8B:
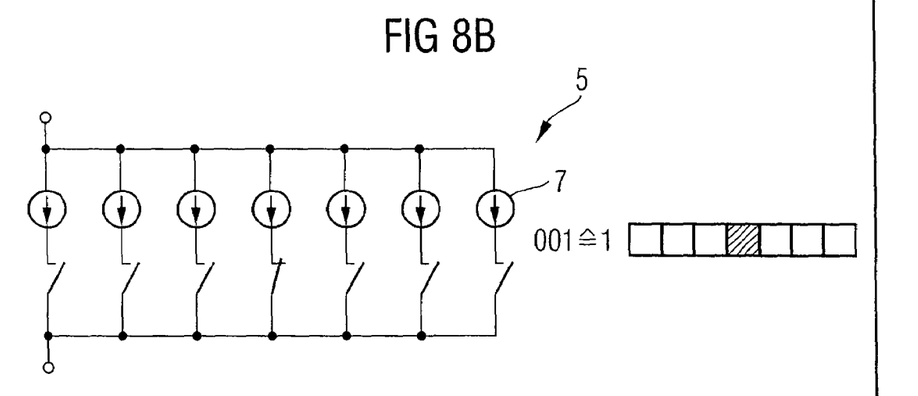
Figure 8C:
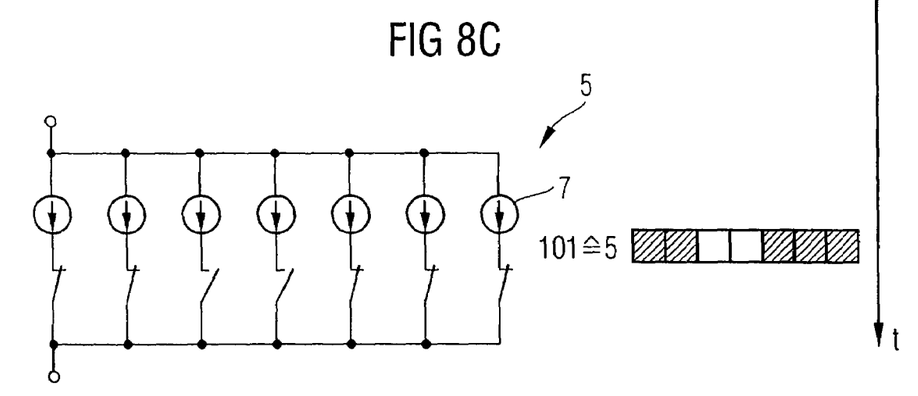

Finally, in accordance with FIG. 8C it is assumed that a digital word with the bit sequence "101", which corresponds to the decimal value "5", is fed to the D/A converter 5. Accordingly, the next five previously unused conversion elements 7 are selected for the corresponding conversion operation, whereby due to the fact that at the end only three conversion elements 7 are still available, said operation starts again cyclically at the beginning of the conversion elements 7, that is to say apart from the last three conversion elements 7 the first two conversion elements 7 of the D/A converter 5 are also selected.

From the above description, it is evident that this concept totally depends on the data sequence, thus explaining the designation "data weighted averaging". The use linked with this concept of the individual conversion elements 7 operating at the maximum rate ensures that rapid averaging out of the errors of the D/A converter 5 can be achieved, which means that accordingly the distortion caused by the non-linearity of the D/A converter 5 can be moved into the high frequency range, where it can be easily filtered out.

Figure 9A:
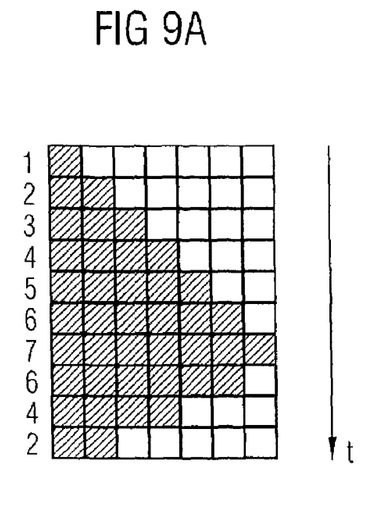
FIG. 9A and FIG. 9B show illustrations for comparison of linear triggering of conversion elements of the digital/analog converter device shown in FIG. 8 with triggering in accordance with a "data weighted averaging" algorithm.
Figure 9B:
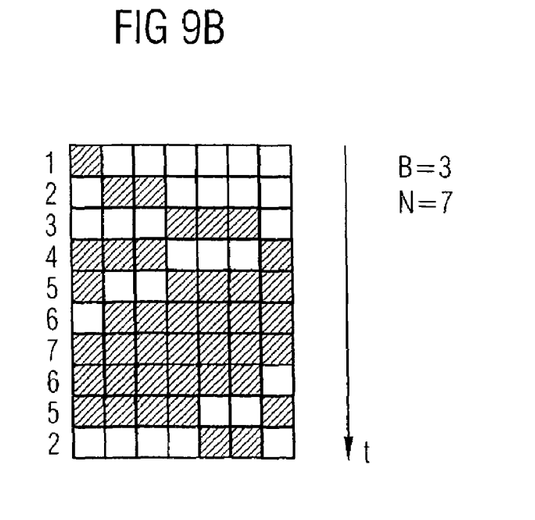

For supplementary explanation of the "data weighted averaging" algorithm FIG. 9 shows for a 3 bit D/A converter with consequently seven conversion elements (that is to say B=3, N=7) a comparison of linear addressing and/or linear selection (see FIG. 9A) with addressing and/or selection in accordance with the "data weighted averaging" algorithm (see FIG. 9B), whereby similar to FIG. 8 it is assumed that the digital words are fed to the D/A converter in chronological order from top to bottom. The corresponding decimal value, which corresponds to an input and/or control code for the conversion elements, is illustrated for each digital word supplied. In the case of linear addressing, the conversion elements are selected in each case beginning with the first conversion element (according to the left column of FIG. 9A), while in the case of the "data weighted averaging" algorithm the conversion elements are selected in each case with the next free, that is to say previously unused, conversion element.

If a "data weighted averaging" algorithm or any other kind of "dynamic element matching" algorithm is used in a time-continuous application, for example in a time-continuous and oversampling sigma delta modulator with "switched capacitor" (SC) technology or in a current-steering D/A converter (DAC), any asymmetry in the states of the individual conversion elements causes non-linear distortion. This asymmetry for example could be a different rise or fall time of the current connected in each case or, if the current of the particular conversion element changes from one output to another output, an unequal connection fault in relation to the opposite direction. SC implementations however do not have the problem of data-dependent interference, since only the steady state final value is important.

In the case of a current-steering D/A converter with N conversion elements the input and/or control code can vary between 0 and N, dependent on how many of the conversion elements should be activated. An input code with the decimal value "0" means that none of the conversion elements are selected and/or activated and therefore no output current of any conversion element contributes to the output signal of the D/A converter, while an input code of N means that all conversion elements are switched through to the output of the D/A converter.

Figure 10:
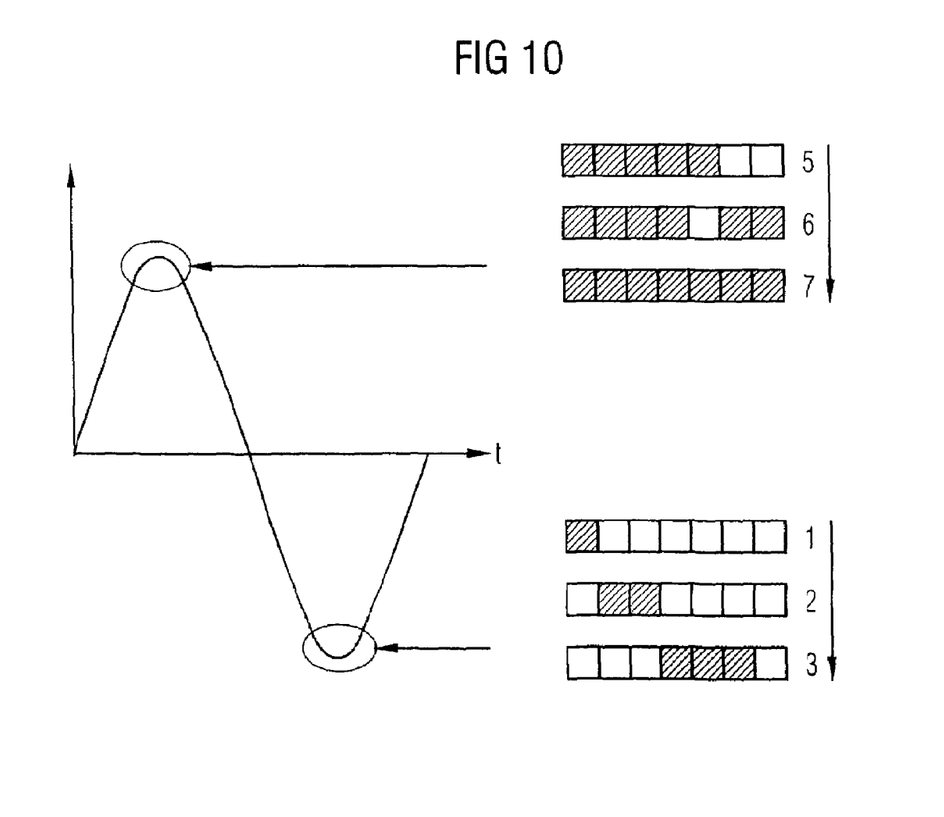
FIG. 10 shows an illustration of a sine wave for clarification of state changes of the conversion elements of the digital/analog converter device illustrated in FIG. 8.

The problem of asymmetry of the type described above will be described below in detail on the basis of FIG. 10, whereby a sine wave, to which a "data weighted averaging" algorithm where N=7 is applied, is illustrated in FIG. 10. It is evident from FIG. 10 that relative to the negative half wave with a variation in the input code of the corresponding D/A converter all conversion elements, which were previously activated, change their state with a transition to the following input code, while relative to the positive half wave with a variation of input code there are conversion elements, which do not change their state. Thus, for example, with a variation of the input code "5" to the input code "6" there are four conversion elements, that is to say the first four conversion elements of the D/A converter, which maintain their activated state. The number of conversion elements, which do not change their state, is even greater with a variation of the input code from "6" to "7". Asymmetry linked with switching the conversion elements or the different rise and fall times leads to the fact that dependent on the particular input code an error arises in the output signal of the D/A converter, which leads to harmonic distortion (in particular of even-number order).

Generally, it can be stated that in the case of a time-continuous D/A converter, which is operated with a "dynamic element matching" algorithm, any asymmetry regarding the state changes of the individual conversion elements is converted into non-linear distortion. For suppressing this error with a variation from one input code to another input code of the D/A converter a "return to zero" codification can be implemented, which however requires a critical path for controlling the timing and moreover due to the necessary dead time leads to the energy of the output pulses being reduced.

Therefore an object of the present invention is to provide a method for digital/analog conversion as well as a digital/analog converter device configured accordingly, with which the problems described above can be eliminated, that is to say also when using a "dynamic element matching" algorithm, particularly a "data weighted averaging" algorithm, non-linear distortion in the analog output signal obtained by the digital/analog conversion can be reduced.

SUMMARY

This object is achieved in accordance with the invention by a method for digital/analog conversion with the features of Claim 1 and/or a digital/analog converter device with the features of Claim 21. The sub-claims in each case define preferred and advantageous embodiments of the present invention.

In accordance with the invention, it is proposed that the problem of asymmetry with a variation from one input code to a new input code, in particular when implementing a "digital weighted averaging" algorithm, is prevented by providing the corresponding digital/analog converter device with redundancy, that is to say by using an M number of conversion elements, which is greater than the maximum number of different input or control codes N>0. This means that the M number of the conversion elements used is greater than the N number of conversion elements which, dependent on the bit width B of the digital word to be converted and/or the corresponding digital/analog converter device, would be necessary for the conversion of a maximum value of the digital word.

Conventionally, in the case of a B bit digital/analog converter device $N=2^b-1$ conversion elements are needed, that is to say the value of the input code supplied can vary between 0 and N. If M>N of conversion elements are used, the redundancy amounts to $R=M/N-1$. Preferably, in the context of the present invention, it is proposed that complete redundancy where R=1, that is to say M=2×N is used, i.e. the M number of the conversion elements is actually twice as great as conventionally would be necessary.

The transition error of each individual conversion element can be coupled by means of redundancy to the corresponding conversion element itself, that is to say for each state change of this conversion element the same transition error is always added to the output signal of the digital/analog converter device. The connection errors (or the different rise and fall times) can thus be treated as a static mismatch, which can be rectified by means of a "dynamic element matching" algorithm. This means that the transition errors together with the static mismatch error can be converted by a "dynamic element matching" algorithm into broadband noise and eliminated by subsequent filtering.

As described, the redundancy R amounts to preferably 1, that is to say M=2×N. With regard to special implementations of the "data weighted averaging" algorithm already described above however redundancy R>1 may also be necessary. Dependent on the "dynamic element matching" algorithm implemented in each case the redundancy of the conversion elements used is preferably selected in such a manner that for each input code variation of the state change and/or transition error of each individual conversion element, addition to the output signal of the digital/analog converter device is always equal, that is to say the conversion elements are triggered and alternatively activated and/or deactivated dependent on the particular input code in such a way that for every variation of input code each previously active and/or selected conversion element changes its state.

For hardware-efficient and reliable implementation of the algorithm described above two interleaved digital/analog converter units can be used, to which a control code is fed alternately for triggering the corresponding conversion elements dependent on the digital word in each case lying on the input side. The output signals generated by the two digital/analog converter units are combined, in particular added on the output side, in order to obtain the desired analog signal. This procedure is equivalent to "return to zero" codification.

An advantage linked with the implementation described above consists in the fact that for triggering the individual digital/analog converter units only two "Enable" bits are required, in order to jointly set the conversion elements of the particular digital/analog converter unit to either "Enable"=1 or "Enable"=0.

Preferably, a separate "data weighted averaging" algorithm is applied to each of these two digital/analog converter units for triggering the corresponding conversion elements dependent on the particular control code, and the two digital/analog converter units are likewise preferably operated at an identical clock frequency, however with a phase shift of half an elementary period.

The two digital/analog converter units can be provided respectively with a redundant number of conversion elements, whereby the condition M/N−1>0 described above is fulfilled for both digital/analog converter units. Fundamentally, however, it is to be noted that the advantage described above is obtained even if no redundant number of conversion elements is used in the two digital/analog converter units.

For reducing possible quantization noise in the analog output signal fed by the implementation described above, the digital/analog converter device can be provided with calibration, which acts upon at least one conversion element of the two digital/analog converter units for correcting a corresponding mismatch between the two digital/analog converter units. This can be implemented particularly simply if the individual conversion elements of the two digital/analog converter units comprise positive and negative current sources respectively, which are switched dependent on the particular bit of the corresponding control code.

Basically the present invention can be used in any application of digital/analog converters, whereby this also covers fully-differential configurations in particular. Preferably, the present invention is suitable for use in the feedback path of time-continuous sigma delta modulators of the type illustrated in FIG. 7 or for application in current-steering stand alone digital/analog converters with oversampling in conjunction with transformation of the noise into a high frequency range by using any arbitrary "dynamic element matching" algorithm.

BRIEF DESCRIPTION OF THE DRAWINGS

The present invention is explained in detail below with reference to the drawing.

DETAILED DESCRIPTION

Figure 1A:
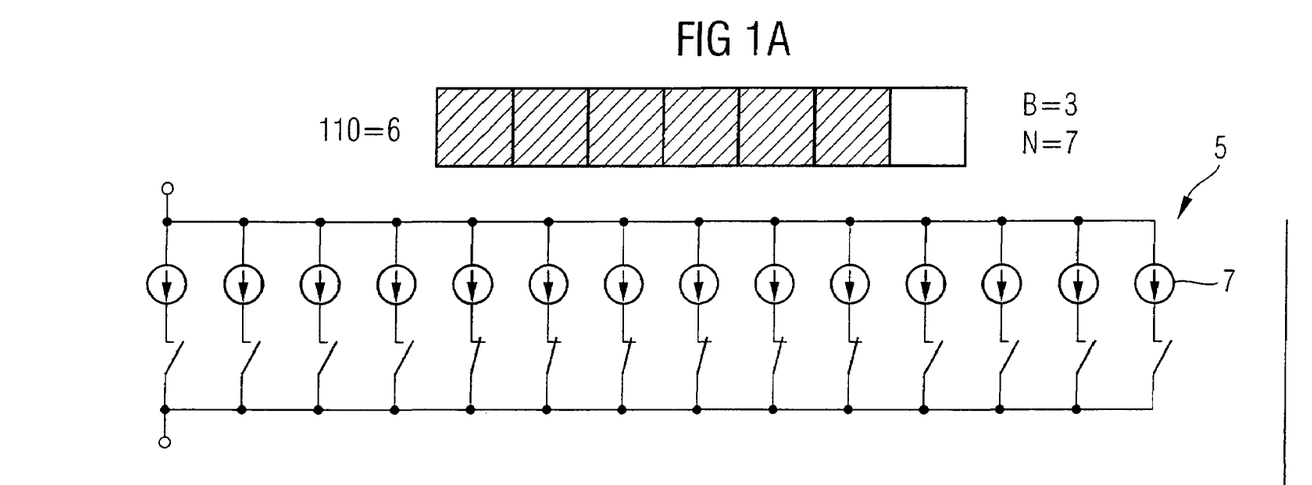
FIG. 1A and FIG. 1B show illustrations of a digital/analog converter device in accordance with a preferred embodiment of the present invention for clarification of the triggering in accordance with the invention of conversion elements of the digital/analog converter device dependent on a particular input code.
Figure 1B:
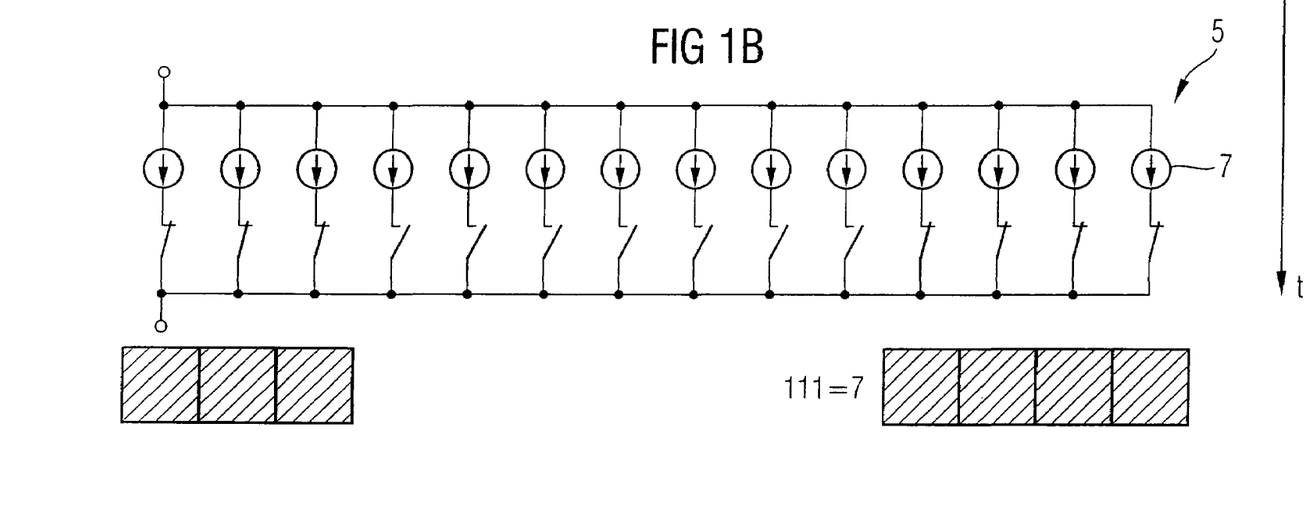

Architecture of a 3 bit D/A converter 5, which as shown in FIG. 7 can be used in the feedback path of a sigma delta modulator, is illustrated in FIG. 1 by way of example. In this case, the D/A converter 5 comprises a plurality of conversion elements 7, again indicated in the form of controllable current sources, which can be selected alternately, that is to say activated or deactivated by means of controllable switches. The conversion elements 7 are again switched in parallel between an input terminal and an output terminal, so that the output signal generated by the D/A converter 5 in each case is constituted as the sum of the current signals generated by the activated conversion elements 7.

The M number of the conversion elements 7 is substantially greater than that N number of conversion elements, which dependent on the selected bit width would be required as maximum value for conversion of the digital word supplied in each case. A B bit D/A converter receives a B bit digital word, whose binary bit sequence corresponds to a decimal range of values between 0 and $2^b-1$. Therefore a B bit D/A converter as maximum value needs $N=2^b-1$ number of conversion elements 7. In the case of the example illustrated B=3, so that N=7 applies.

In the case of the example illustrated, the M number of the actually provided conversion elements 7 selected is M=2× N=14.

In accordance with FIG. 1A, it is assumed that the binary bit sequence "110" as 3 bit digital word to be converted is fed to the D/A converter 5, which corresponds to the decimal value "6", so that a conversion element selection logic allocated to the D/A converter 5, for example the conversion element selection logic 4 shown in FIG. 7, triggers the individual conversion elements 7 of the D/A converter in such a manner that six of these conversion elements 7 are activated in total, while the other conversion elements are deactivated. The corresponding triggering/deactivation pattern is illustrated at the top in FIG. 1, whereby the activated conversion elements 7 are again indicated by hatched boxes.

In accordance with FIG. 1B it is also assumed that on the basis of the state shown in FIG. 1A the binary bit sequence "111" as 3 bit digital word to be converted is subsequently fed to the D/A converter 5, which thus corresponds thus to a decimal input and/or control code of "7". In accordance with a "data weighted averaging" algorithm those conversion elements 7 of the D/A converter 5 are therefore selected and activated, which were not previously activated, whereby the conversion elements are cyclically selected, that is to say the last four conversion elements 7 and the first three conversion elements 7 of the D/A converter 5 are activated and selected for conversion of the digital word "111".

If the illustration of FIG. 1A is compared with the illustration of FIG. 1B it becomes clear that even with a transition of the input code from "6" to "7" no conversion element 7, which is activated and selected both in accordance with FIG. 1A and in accordance with FIG. 1B, is present. Each conversion element 7 active in accordance with FIG. 7 due to redundancy of the conversion elements 7 with the transition in FIG. 1B can change into a deactivated state, whereby this particularly applies irrespective of the actual input code. For each individual conversion element 7 therefore with each variation of the input code the same state and/or transition error is always added to the output signal of the D/A converter 5.

In FIG. 2 again for the example shown in FIG. 1 a sequence of several input and/or control codes fed chronologically one after the other is illustrated for the individual conversion elements 7 of the D/A converter 5 (B=3, N=7, M=14) with the allocation in each case resulting therefrom. The particular conversion elements to be triggered by the digital word to be converted and/or the corresponding input code are illustrated by FIG. 2 in each row again either with a hatched box (if they are activated) or with a blank box (if they are deactivated). For the conversion elements triggered in accordance with the respective input code in principle a state change is possible ("Enable"=1), while for all other conversion elements of the D/A converter 5 no state change should be possible ("Enable"=0). The second group of conversion elements 7 mentioned is marked in FIG. 2 in each row with a cross. From FIG. 2 it is likewise evident that irrespective of the input code supplied in each case no conversion elements 7 activated at time-point t, which do not change their state with the input code supplied subsequently, that is to say at a time-point t+1, and continue to be activated, are present.

FIG. 3 once again clarifies the "data weighted averaging" algorithm with redundancy described above on the basis of FIG. 1 and FIG. 2, which can thus be designated as a "redundant cell data weighted averaging" algorithm, on the basis of the example of a sine wave similar to FIG. 10. In this case for the negative half wave of the sine wave the transition from the input code "2" to the input code "3" and for the positive half wave the transition from the input code "6" to the input code "7" are illustrated by way of example. The conversion elements activated dependent on the input code supplied in each case (according to the digital word to be converted) are again indicated with a hatched box, while the conversion elements not activated in each case are indicated with a blank box. Additionally, in FIG. 3 an "Enable" pointer is also indicated in the form of an arrow, which in each case designates the beginning of that group of conversion elements, for which in principle dependent on the digital word supplied in each case and/or the corresponding input code triggering should be possible, that is to say for the conversion elements of this group in each case "Enable"=1, while for all other conversion elements "Enable"=0 applies. The latter group of conversion elements is again marked in FIG. 3 with a cross.

Figure 3:
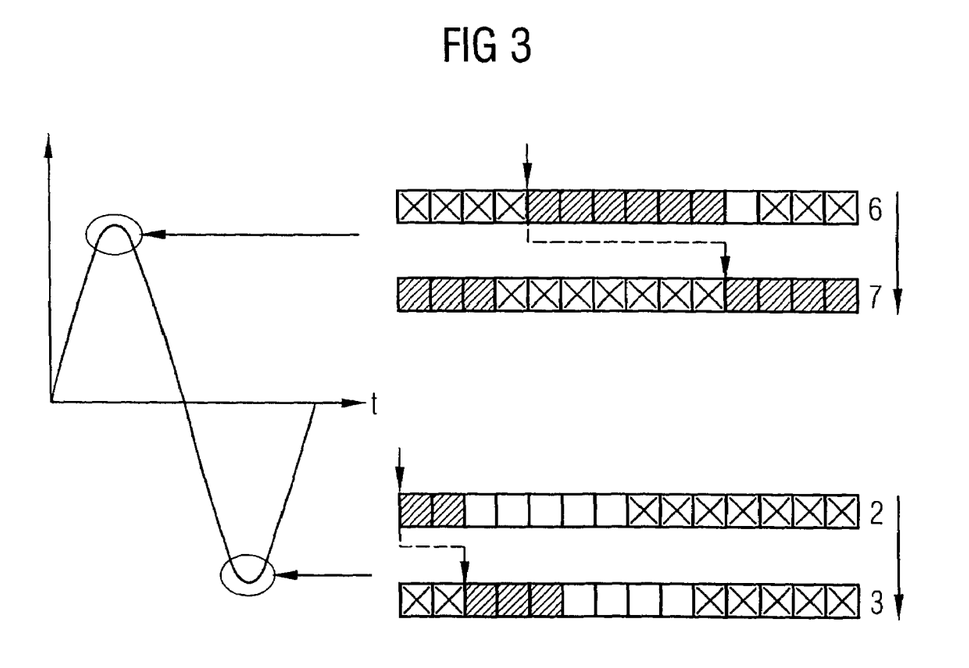
FIG. 3 shows an illustration of a sine wave for clarification of state changes with the individual conversion elements in application of the present invention.

From FIG. 3 it is evident on the one hand that with each variation of input code the "Enable" pointer is set to the next free, that is to say unused, conversion element. Furthermore it is also evident from the illustration of FIG. 3 that, in contrast to FIG. 10, even with a variation of the input code from "6" to "7" due to the redundancy of the conversion elements no conversion elements, which are active, that is to say selected both with the input code "6" and also with the input code "7", are present.

The redundancy concept described above on the basis of FIG. 1–FIG. 3 in principle can be applied to any "dynamic element matching" algorithm and for any arbitrary redundancy R=M/N−1>0.

The invention is also applicable particularly for full differential configurations, in which here where "Enable"=1 dependent on the input code for the particular conversion element either an allocated positive output or a negative output is activated. In the case of a "single ended" embodiment in accordance with FIG. 1 however the output signal of a conversion element where "Enable"=0 (box with cross)

in principle does not differ from that in the case of non activation (blank box in the input code).

Figure 2:
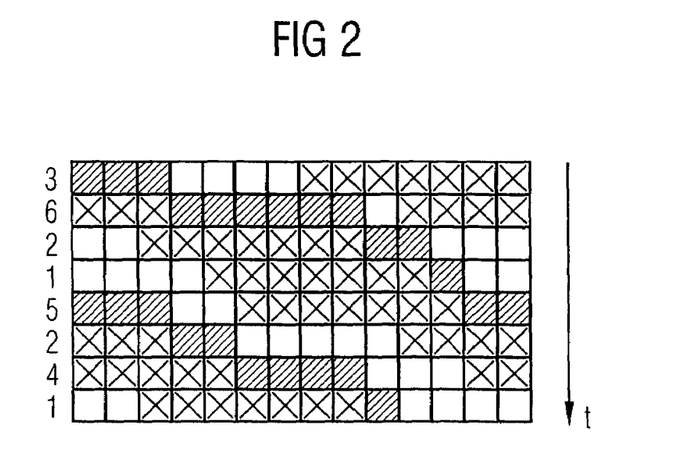
FIG. 2 shows an illustration for clarification of the triggering of the conversion elements illustrated in FIG. 1 dependent on the particular input code.
Figure 4:
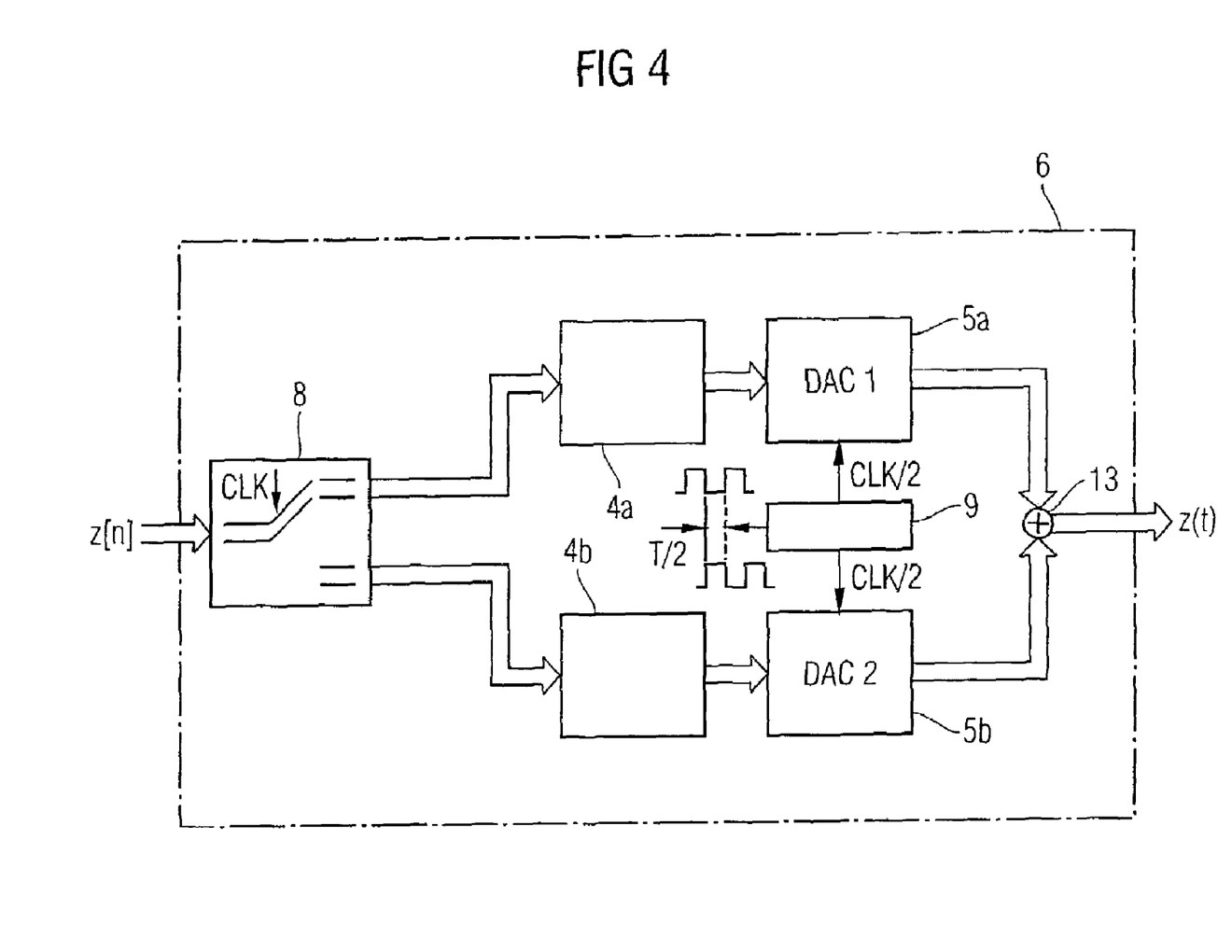
FIG. 4 shows a possible implementation of a digital/analog converter device of the present invention.

A possible hardware-efficient and stable implementation of the "redundant cell data weighted averaging" algorithm explained on the basis of FIG. 1–FIG. 3 is illustrated in FIG. 4.

The digital/analog converter device 6 illustrated in FIG. 4 comprises two interleaved digital/analog converter units 5a, 5b (in FIG. 4 also designated as DAC1 and DAC2) in such a way that one of the two digital/analog converter units 5a, 5b in each case contributes alternately to the analog output signal z(t). For this purpose, the time-discrete digital input signal z[n] lying on the input side is sampled by a scanner 8 in such a manner that in each case a digital word to be converted is alternately fed to the digital/analog converter unit 5a and/or the digital/analog converter unit 5b. Individually separate conversion element selection logics 4a, 4b are allocated to the two digital/analog converter units 5a, 5b, which dependent on the digital word supplied in each case generate a control code for triggering the corresponding conversion elements of the particular digital/analog converter unit 5a, 5b. Each of the conversion element selection logics 4a, 4b can apply a "data weighted averaging" algorithm, in particular a "redundant cell data weighted averaging" algorithm of the kind described above, irrespective of the particular other conversion element selection logic. The individual digital/analog converter units 5a, 5b however do not necessarily have to contain a redundant number of conversion elements. On the contrary the concept illustrated in FIG. 4 can also be applied to digital/analog converter units with no redundancy.

The sampling rate of the scanner 8 is designated in FIG. 4 as CLK. After a digital word is alternately fed by the scanner 8 to the upper and lower converter path respectively, the digital/analog converter units 5a, 5b in each case must only process every second digital word of the digital signal lying on the input side. Therefore a control 9 is provided, which in the sense of a clock generator supplies a clock pulse, whose frequency corresponds to half the sampling rate of the scanner 8, to the two digital/analog converter units 5a, 5b, whereby however a phase shift of T/2 exists between the clock pulses of the two digital/analog converter units 5a, 5b as indicated in FIG. 4, T designating the elementary period of the two clock pulses.

The output signals generated by the two digital/analog converter units 5a, 5b are combined by means of an adder 13 into the desired analog output signal z(t). The operation of the digital/analog converter device illustrated in FIG. 4 is equivalent to "return to zero" codification, whereby the mode of operation will be described in detail below on the basis of FIG. 6.

Figure 6:
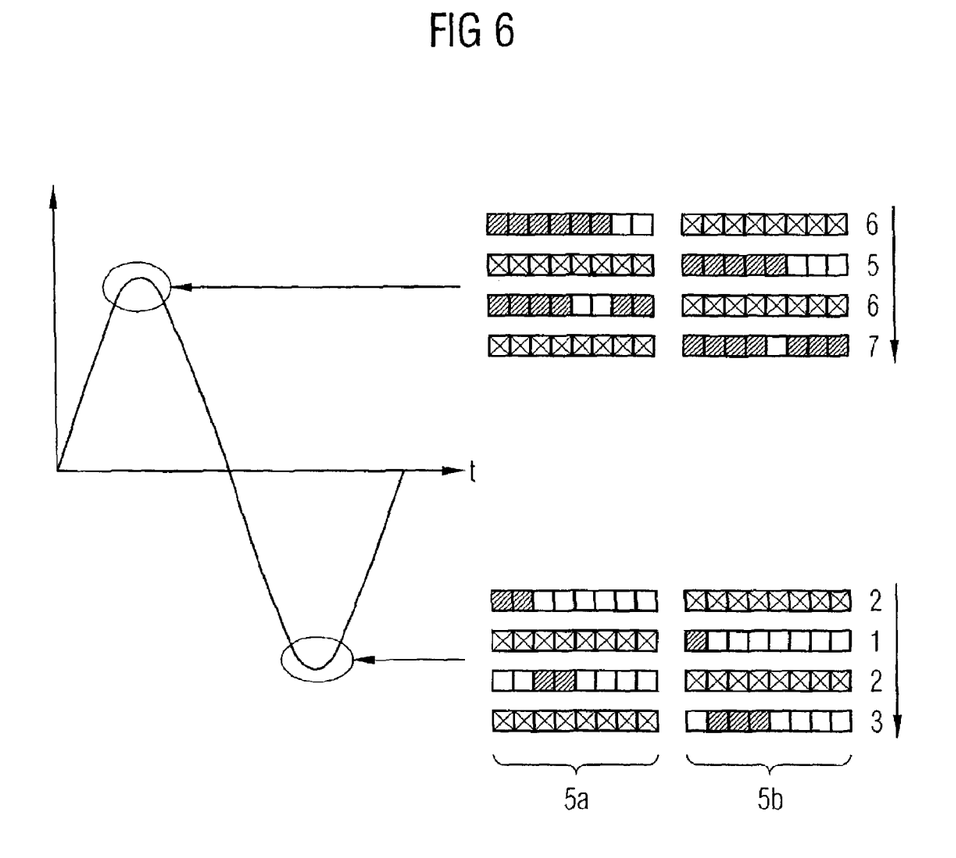
FIG. 6 shows an illustration of a sine wave for clarification of state changes of individual conversion elements of two digital/analog converter units illustrated in FIG. 4 and FIG. 5.

Similar to FIG. 3 by way of example for the negative half wave of a sine wave the transition from the input code "2" to the input code "1" as well as subsequently to the input code "2" and the input code "3" is illustrated in FIG. 6. Likewise for the positive half wave of the sine wave the transition from the input code "6" to the input code "5" as well as again to the input code "6" and to the input code "7" is illustrated. The conversion elements activated dependent on the input code supplied in each case (according to the particular digital word to be converted) are indicated with a hatched box, while the conversion elements not to be activated in each case are indicated with a blank box. In the left column of FIG. 6 the conversion elements of the first digital/analog converter unit 5a and in the right column the conversion elements of the second digital/analog converter unit 5b are illustrated respectively. For the conversion elements corresponding to the hatched boxes and the blank boxes in each case "Enable" =1 applies, while for the conversion elements marked with a cross "Enable"=0 applies.

From FIG. 6 it is evident how one input code is varied to the other input code between the digital/analog converter unit 5a and the digital/analog converter unit 5b, whereby in each case the conversion elements of that digital/analog converter unit, which does not contribute instantaneously to the analog output signal digital of the analog converter device, is blocked by "Enable"=0, so that for the conversion elements of this digital/analog converter unit no state change is possible.

An advantage of the implementation illustrated in FIG. 4 is that in principle only two "Enable" bits are necessary, that is to say in each case one "Enable" bit for each of the two digital/analog converter units of 5a, 5b, since by means of this single "Enable" bit all conversion elements of the particular digital/analog converter unit 5a, 5b can be released or blocked for a state change in each case, while with the embodiment described above on the basis of FIG. 1–FIG. 3 in principle a separate "Enable" bit is necessary for each individual conversion element, that is to say $2^b-1$ "Enable" bits in total.

In the case of the digital/analog converter device illustrated in FIG. 4 a mismatch in the sum of the conversion elements of the two digital/analog converter units 5a, 5b can lead to an increase in the quantization noise, although as a result of the sum of N conversion elements a match better by the factor sqrt(N) can be achieved in comparison to a single conversion element. If however this is not sufficient, the quantization noise can be reduced by calibration of the digital/analog converter units 5a, 5b and/or of the conversion elements contained therein.

Such sum calibration can be effectively carried out particularly if the digital/analog converter units 5a, 5b are designed with conversion elements of dual polarity, that is to say each conversion element consists of a positive current source (PMOS) and a negative current source (NMOS), which dependent on the corresponding data bit of the control code supplied in each case are connected to the respective opposite output. The entire positive current supplied by the particular digital/analog converter unit thereby corresponds to the sum of the currents supplied by the positive current sources, while the entire negative current corresponds to the sum of the currents supplied by the negative current sources.

If in the case of the digital/analog converter device illustrated in FIG. 4 the entire positive and/or negative current of the digital/analog converter unit 5a is designated as $I_{pi}$ and/or $I_{ni}$, and the entire positive and/or negative current supplied by the digital/analog converter unit 5b is designated as $1_{p2}$ and/or $I_{n2}$, then with the total currents supplied by the digital/analog converter units 5a and 5b being equal, $I_{p1}+I_{n1}=I_{p2}+I_{n2}$ applies (the total current supplied by a digital/analog converter unit consists of the sum of the entire positive current and the entire negative current together). This condition for example can be fulfilled, if as a result of the calibration $I_{p1}=I_{n2}$ and $I_{n1}=I_{p2}$ are set.

This can be achieved for example by only one current source, that is to say one conversion element, being trimmed in both digital/analog converter units 5a, 5b. This will be described in detail below on the basis of FIG. 5.

Figure 5:
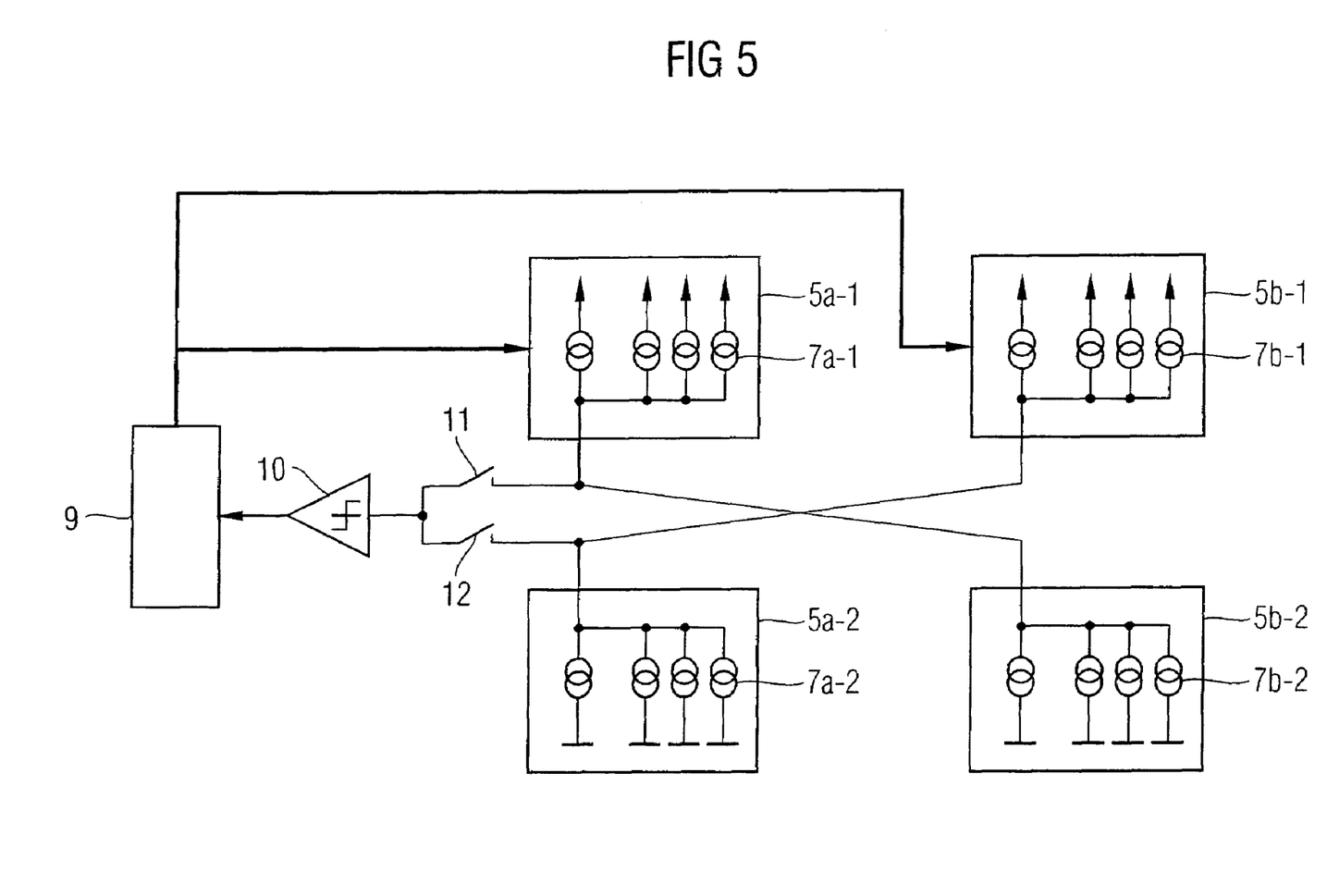
FIG. 5 shows a schematic illustration for clarification of the calibration of the digital/analog converter device illustrated in FIG. 4.

In FIG. 5 the two digital/analog converter units 5a and 5b are in each case divided into two blocks, whereby the blocks 5a-1 and 5b-1 respectively comprise the positive current sources 7a-1 and/or 7b-1 of the corresponding conversion elements, while the blocks 5a-2 and 5b-2 respectively comprise the negative current sources 7a-2 and/or 7b-2 of the corresponding current sources. In addition, FIG. 5 illustrates the control 9 already shown in FIG. 4, which in accordance with FIG. 5 takes over the function of a calibration logic. For calibration first when starting the digital/analog converter device, a switch 11 can be closed and a switch 12 can be opened, so that the control 9 by means of a comparator 10 through corresponding trimming of a current source 7a-1 and/or 7b-1 respectively of the two blocks 5a-1 and/or 5b-2 can act upon the two digital/analog converter units 5a, 5b in such a manner that the sum of the currents, that is to say the current $I_{p1}$, supplied by the positive current sources 7-1 of the block 5a-1, corresponds to the sum of the currents, that is to say the current $I_{n2}$, supplied by the negative current sources 7b-2 of the block 5b-2. This is possible, since the switch 11 on the one hand is connected to the block 5a-1 and on the other hand to the block 5b-2. Subsequently, the switch 11 is opened and the switch 12 is closed, so that the control 9 through trimming at least one of the current sources 7a-1 and at least one of the current sources 7b-1, can ensure that the current fed by the positive current sources 7b-1 of the block 5b-1, that is to say the current $1_{p2}$, corresponds to the current, that is to say the current $I_{n1}$, supplied by the negative current sources 7a-2 of the block 5a-2 (the switch 12 as shown in FIG. 5 is connected to the blocks 5a-2 and 5b-1).

If the mismatch between the currents is $I_{p1}$ and $I_{n2}$ and/or $I_{n1}$ and $I_{p2}$ is too great, more than one adjustable current source can be used in the individual blocks in each case.

Naturally, other calibration methods, by means of which $I_{p1}+I_{n1}=I_{p2}+I_{n2}$ can be obtained are also conceivable.

What is claimed is:

1. A method for digital/analog conversion of a digital word using conversion elements, the digital word having a format defining a number N of conversion elements necessary to generate an output signal for any digital word provided as input, the method comprising:
    a) generating, based on a digital word to be converted, a control code for a first number of conversion elements of M available conversion elements, wherein M is greater than N, and wherein the control code indicates whether each of the first number of conversion elements should be have a first activation state,
    b) triggering a set of the M available conversion conversion elements in accordance with the control code, wherein a corresponding output signal is generated by the triggered set of the M available conversion elements; and
    c) combining the output signals generated by the triggered set of conversion elements such that the analog signal corresponding to the digital word is obtained.

2. The method according to claim 1, wherein the digital word has a format with a bit width of B, N is equal to $2^B-1$ and M/N−1 is greater than 0.

3. The method according to claim 2, wherein M/N−1 is greater than 1.

4. The method according to claim 1, wherein M is equal to 2×N.

5. The method according to claim 1, wherein step b) further comprises triggering the set of the M available conversion elements such that irrespective of the particular control code for each individual conversion element, a same error of any conversion element is always added to the output signal.

6. The method according to claim 1, wherein step b) further comprises triggering the set of the M available conversion elements such that with each variation of the control code a previously triggered conversion element is deactivated.

7. The method according to claim 1, wherein step b) further comprises triggering the set of the M available conversion elements in accordance with a dynamic element matching algorithm.

8. The method according to claim 1, wherein step b) further comprises triggering the set of the M available conversion elements in accordance with a data weighted averaging algorithm.

9. The method according to claim 1, wherein each conversion element includes a current source and step c) further comprises combining output current signals of the triggered set of conversion elements.

10. The method according to claim 1, wherein step c) further comprises combining the output signals by adding the output signals of the triggered set of conversion elements.

11. The method according to claim 1, wherein the M conversion elements are divided into a first digital/analog converter unit and a second digital/analog converter unit, wherein steps a), b) and c) are repeated for a plurality of digital words, and wherein step a) further comprises alternately generating a first control code for the first digital/analog converter unit and a second control code for the second digital/analog converter unit;
    wherein step c) further comprises combining output signals of the first digital/analog converter unit and the second digital/analog converter unit.

12. The method according to claim 11, wherein step c) further comprises adding output signals of the first digital/analog converter unit and the second digital/analog converter unit.

13. The method according to claim 11, wherein the first digital/analog converter unit and the second digital/analog converter unit operate at a substantially identical clock frequency.

14. The method according to claim 11, wherein b) further comprises alternately triggering a first set of conversion elements in the first digital/analog converter unit in accordance with a data weighted averaging algorithm and triggering a second set of conversion elements in the second digital/analog converter unit in accordance with the data weighted averaging algorithm.

15. The method according to claim 11, further comprising a step of calibrating at least one of the first digital/analog converter unit and the second digital/analog converter unit to compensate for a mismatch between the output signals of the first digital/analog converter unit and the second digital/analog converter unit.

16. The method according to claim 15, wherein each of at least one conversion element of the first digital/analog converter unit and at least one conversion element of the second digital/analog converter unit comprises a positive current source and a negative current source, and wherein the calibrating step further includes:
    selectively triggering at least one of a positive current source or a negative current source of at least one conversion element of the first digital/analog converter unit such that the sum of a set of output signals of the positive current sources of the first digital/analog converter unit corresponds to the sum of a set of output signals of the negative current sources of the second digital/analog converter unit and the sum of a set of output signals of the negative current sources of the first digital/analog converter unit corresponds to the sum of a set of output signals of the positive current sources of the second digital/analog converter unit.

17. The method according to claim 11, further comprising operably coupling the output signal to a feedback input of a sigma delta modulator.

18. The method according to claim 11, further comprising performing oversampling on a digital signal to generate the plurality of digital words.

19. A digital/analog converter device, comprising:
a set of conversion elements, the set of conversion elements including M conversion elements, each of the set of conversion elements operable to be triggered and to generate an output signal when triggered;
a selection logic control element configured to trigger at least some of the conversion elements in accordance with a control code, the control code corresponding to a digital word to be converted;
an output operably coupled to combine output signals of triggered conversion elements to generate the analog signal corresponding to the digital word;
wherein M is greater than a number N of conversion elements necessary for digital/analog conversion of a maximum value of the digital word to be converted.

20. The digital/analog converter device of claim 19, wherein the selection logic control element is operable to perform a dynamic element matching algorithm.

21. The digital/analog converter of claim 19, wherein the digital/analog converter device is differentially configured.

22. The digital/analog converter device according to claim 19, further comprising a first digital/analog converter unit that includes a portion of the set of conversion elements and a second digital/analog converter unit (5b) that includes a second portion of the set of conversion elements, and wherein:
the selection logic control element is configured in to, for a plurality of digital words in a digital signal, alternately generate the control code for the conversion elements of the first digital/analog converter unit and generate the control code for the conversion elements of the second digital/analog converter unit.

23. The digital/analog converter device according to claim 22, wherein the output is operable to perform a summation.

24. The digital/analog converter device according to claim 22, further comprising a clock generator operably connected to provide clocking signals having an identical clock frequency to the first digital/analog converter unit and the second digital/analog converter unit.

25. The digital/analog converter device according to claim 22, further comprising a sampling device, and wherein:
the selection logic control element comprises a first control element operable to trigger the conversion elements of the first digital/analog converter unit and a second control element operable to trigger the conversion elements of the second digital/analog converter unit, and
the sampling device is operable to sample the digital signal and to provide the digital words alternately to the first control element and the second control element.

26. The digital/analog converter device of claim 25, wherein the first control element is configured to trigger the conversion elements of the first digital/analog conversion unit in accordance with a data weighted averaging algorithm and the second control element is configured to the conversion elements of the second digital/analog converter unit in accordance with the data weighted averaging algorithm.

27. The digital/analog converter device of claim 26, further comprising a calibration control element operable to calibrate the conversion elements of the first digital/analog converter unit and conversion elements of the second digital/analog converter unit.

28. The digital/analog converter device of claim 27, wherein:
each of the conversion elements of the first digital/analog converter unit and the second digital/analog converter unit comprises a positive current source and a negative current source,
the calibration control element is operable to trigger at least one of a positive current source or a negative current source of at least one conversion element in such a manner that the sum of the output signals of the positive current sources of the first digital/analog converter unit corresponds to the sum of the output signals of the negative current sources of the second digital/analog converter unit and the sum of the output signals of the negative current sources of the first digital/analog converter unit corresponds to the sum of the output signals of the positive current sources of the second digital/analog converter unit.

* * * * *